(12) United States Patent
Ando et al.

(10) Patent No.: US 10,811,413 B2
(45) Date of Patent: Oct. 20, 2020

(54) MULTI-THRESHOLD VERTICAL FETS WITH COMMON GATES

(71) Applicant: International Business Machines Corporation, Armonk, NY (US)

(72) Inventors: Takashi Ando, Tuckahoe, NY (US); Reinaldo Vega, Mahopac, NY (US); Choonghyun Lee, Rensselaer, NY (US); Hari Mallela, Poughquag, NY (US); Li-Wen Hung, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/101,659

(22) Filed: Aug. 13, 2018

(65) Prior Publication Data

US 2020/0051979 A1    Feb. 13, 2020

(51) Int. Cl.

| | |
|---|---|
| *H01L 27/092* | (2006.01) |
| *H01L 21/8238* | (2006.01) |
| *H01L 21/28* | (2006.01) |
| *H01L 29/49* | (2006.01) |
| *H01L 29/51* | (2006.01) |
| *H01L 29/423* | (2006.01) |
| *H01L 29/78* | (2006.01) |
| *H01L 29/66* | (2006.01) |

(52) U.S. Cl.
CPC ...... *H01L 27/092* (2013.01); *H01L 21/28202* (2013.01); *H01L 21/823857* (2013.01); *H01L 29/42364* (2013.01); *H01L 29/4966* (2013.01); *H01L 29/513* (2013.01); *H01L 29/517* (2013.01)

(58) Field of Classification Search
CPC ....... H01L 21/823857; H01L 21/28202; H01L 21/28211; H01L 27/092; H01L 29/42364; H01L 29/517; H01L 29/513; H01L 29/7827; H01L 29/7828; H01L 29/66666
USPC ......... 257/369, 329, E27.062; 438/216, 268, 438/287
See application file for complete search history.

(56) References Cited

U.S. PATENT DOCUMENTS

| | | |
|---|---|---|
| 9,257,518 B2 | 2/2016 | Baudot et al. |
| 9,281,310 B2 | 3/2016 | Ji et al. |
| | (Continued) | |

OTHER PUBLICATIONS

Clark, R. D. (2014). Emerging applications for high k materials in VLSI technology. Materials, 7(4), pp. 2913-2944.

(Continued)

*Primary Examiner* — Mohammed Shamsuzzaman
*Assistant Examiner* — Aaron J Gray
(74) *Attorney, Agent, or Firm* — Cantor Colburn LLP

(57) ABSTRACT

Multi-voltage threshold vertical transport transistors and methods of fabrication generally include forming the transistors with vertically oriented silicon fin channels for both the n-type doped field effect transistors (nFET) and the p-type doped field effect transistors (pFET). A silicon oxynitride interfacial layer is provided on sidewalls of the fins in the nFET and a silicon dioxide interfacial with aluminum is provided on sidewalls of the fins in the pFET to provide an aluminum induced dipole. A high k dielectric overlays the interfacial layers and a common work function metal overlays the high k dielectric layer to define a gate structure.

13 Claims, 7 Drawing Sheets

(56) References Cited

U.S. PATENT DOCUMENTS

| | | | |
|---|---|---|---|
| 9,343,373 | B2 | 5/2016 | Manabe |
| 9,653,602 | B1* | 5/2017 | Cheng ................. H01L 29/7845 |
| 9,780,183 | B2 | 10/2017 | Kim et al. |
| 10,170,477 | B2 | 1/2019 | Bao |
| 2012/0025321 | A1* | 2/2012 | Manabe .......... H01L 21/823835 257/369 |
| 2016/0149019 | A1* | 5/2016 | Chen .................... H01L 27/092 257/329 |
| 2016/0225868 | A1* | 8/2016 | Kim ................ H01L 21/823462 |
| 2017/0162686 | A1 | 6/2017 | Arimura |
| 2017/0221772 | A1 | 8/2017 | Chiang et al. |

OTHER PUBLICATIONS

Soussou, A. (2014). Modeling and characterization of electrical effects of Ge integration in Metal/High-k/SiGe MOS structures Doctoral dissertation, Universite de Grenoble, (191 pages total).

Yamaguchi, S., Bayindir, Z., He, X. et al. (2017). Effective work-function control technique applicable to p-type FinFET high-k/metal gate devices. Microelectronics Reliability, 72, pp. 80-84.

\* cited by examiner

MULTI-THRESHOLD VERTICAL FETS WITH COMMON GATES

BACKGROUND

The present invention relates in general to semiconductor fabrication methods and resulting structures. More specifically, the present invention relates to multi-threshold vertical field effect transistors (MTVFETs) with common gates for both the n-type doped FET (nFET) and p-type doped FET (pFET).

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain, and electrical current flows through the channel region from the source to the drain. The electrical current flow is induced in the channel region by a voltage applied at the gate electrode. Complementary metal oxide semiconductor (CMOS) is a technology that uses complementary and symmetrical pairs of p-type and n-type MOSFETs to implement logic functions. Multi-threshold vertical field effect transistors (MTVFETs) are a variation of CMOS chip technology that has transistors with multiple threshold voltages (Vth) in order to optimize delay or power.

SUMMARY

Embodiments of the invention are directed to semiconductor devices each having a multi-threshold voltage structure and methods for forming such semiconductor devices. A non-limiting example of a semiconductor device according to aspects of the invention includes a first transistor and a second transistor. The first transistor includes a first channel region material including a first gate electrode structure including a silicon oxynitride interfacial layer, a high k dielectric layer, and a work function metal. The first channel region includes one or more vertically oriented fins formed of a crystalline silicon. The second transistor includes a second channel region material including a second gate electrode structure. The second gate electrode structure includes a silicon dioxide with aluminum interfacial layer, a high k dielectric layer, and the same work function metal as the first transistor. The second channel region includes one or more vertically oriented fins formed of the crystalline silicon.

Another non-limiting example of a semiconductor device according to aspects of the invention includes a substrate and a shallow trench isolation region in the substrate separating at least one n-type doped field effect transistor (nFET) and at least one p-type doped field effect transistor (pFET). The at least one nFET includes an n-type doped bottom source or drain (source/drain) region, one or more vertically oriented fins formed of silicon extending from the bottom source/drain region, a bottom spacer layer; a silicon oxynitride interfacial layer on sidewalls of the one or more vertically oriented fins, a high k dielectric layer overlying the silicon oxynitride interfacial layer, a work function metal on the high k dielectric layer, a top spacer layer and an n-type doped top source/drain region on the top portion of the one or more fins. The at least one pFET includes a p-type doped bottom source/drain region, one or more vertically oriented fins formed of the silicon extending from the bottom source/drain region, a bottom spacer layer; a silicon dioxide interfacial layer with aluminum on sidewalls of the one or more vertically oriented fins, a high k dielectric layer overlying the silicon dioxide interfacial layer, a work function metal on the high k dielectric layer, a top spacer layer and a p-type doped top source/drain region on the top portion of the one or more fins. The work function metal in the at least one nFET and the at least one pFET is shared.

Another non-limiting example of a semiconductor device according to aspects of the invention includes an n-type doped field effect transistor (nFET) and a p-type doped field effect transistor (pFET). A shallow trench isolation region filled with a dielectric material electrically isolates the nFET from the pFET. One or more vertically oriented silicon fins are coupled to n-type doped and p-type doped top and bottom source/drain regions in the nFET and pFET, respectively, wherein the nFET and pFET share a common work function metal formed on a high k dielectric. A silicon oxynitride interfacial layer is provided on sidewalls of the one or more vertically oriented silicon fins in the nFET, and a silicon oxide interfacial layer with aluminum is provided on sidewalls of the one or more vertically oriented silicon fins in the pFET.

Another non-limiting example of a method for forming a semiconductor structure having a multi-threshold voltage structure according to aspects of the invention includes forming a p-type doped field effect transistor (pFET) including forming a silicon dioxide interfacial layer on sidewalls of one or more vertically oriented fins. A high k dielectric layer is deposited overlaying the silicon dioxide interfacial layer on the sidewalls of the one or more vertically oriented silicon fins. An aluminum containing layer is deposited overlying the high k dielectric layer. The substrate is annealed to drive aluminum from the aluminum containing layer through the high k layer and into the silicon dioxide interfacial layer to form an aluminum induced dipole therein. A work function metal is deposited on the high k dielectric layer.

Another non-limiting example of a method for forming a semiconductor structure having a multi-threshold voltage structure according to aspects of the invention includes forming a plurality of vertically oriented silicon fins on a substrate. A bottom source/drain region is formed to define a nFET region and a pFET region. The bottom source/drain region in the nFET region is doped with an n-type dopant and the bottom source drain region in the pFET region is doped with a p-type dopant. The nFET region is electrically isolated from the pFET region. A bottom spacer layer is deposited onto the substrate. The surface of the vertically oriented fins is reacted to form a silicon oxynitride on the sidewalls of the one or more silicon fins in the nFET region and the pFET region. A conformal nitride layer is deposited and patterned so as to remove the conformal nitride layer and the silicon oxynitride interfacial layer from the pFET region. The conformal nitride layer is removed from the nFET region. The silicon on sidewalls of the vertically oriented fins is oxidized in the pFET region to form a silicon dioxide interfacial layer. A high k dielectric layer is deposited onto the substrate. A conformal aluminum-containing metal layer is deposited onto the substrate. The conformal aluminum-containing metal layer is patterned to remove the aluminum-containing metal layer from the nFET region. The substrate is annealed to drive aluminum in the aluminum containing layer through the high k dielectric layer into the silicon dioxide interfacial layer in the pFET. A conformal common work function layer is deposited onto the substrate in both the nFET region and the pFET region.

DETAILED DESCRIPTION

Figure 1:
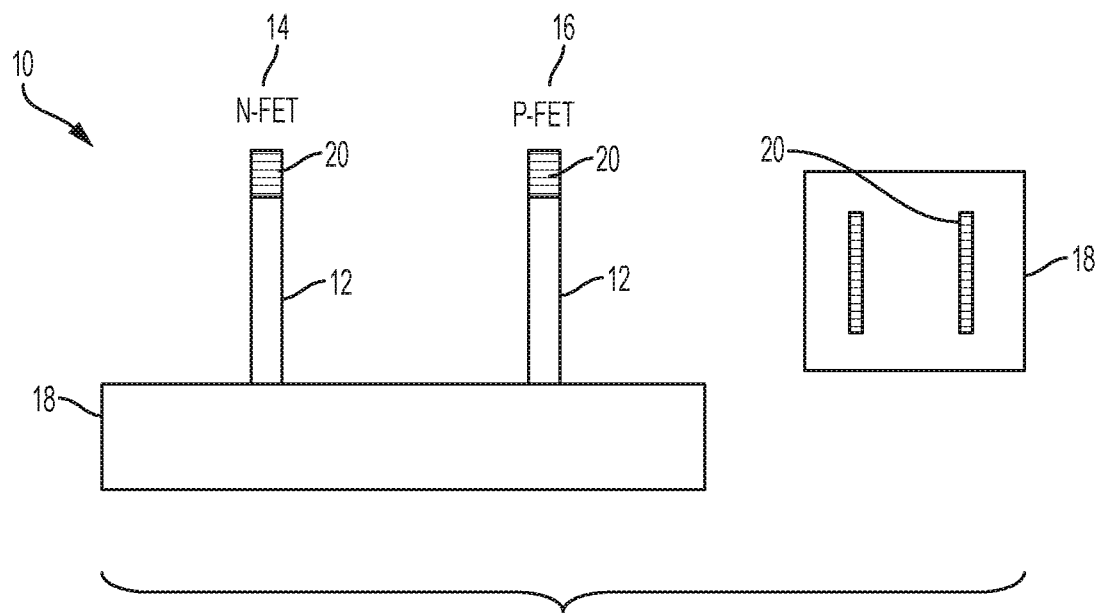
FIG. 1 depicts a cross-sectional view of a semiconductor structure after a fabrication operation according to one or more embodiments of the present invention.

There is an increasing demand for multiple threshold voltage offerings in semiconductor technology. For a given semiconductor technology, a device menu exists including low threshold voltage and high threshold voltage devices, for each of the n-type and p-type field effect transistors (nFET and pFET, respectively). Circuit design optimization can require more than two threshold voltage offerings, in which case, more granularity in the threshold voltage offering is desired between the highest and lowest threshold voltage devices in the device menu. By way of example, advanced complementary metal oxide semiconductor (CMOS) technology requires at least four pairs of threshold voltages for different applications. This demand can be met through several approaches, most typically involving channel doping. However, channel doping degrades mobility and increases threshold voltage variability. It is desirable to satisfy as many threshold voltage requirements as possible without requiring channel doping.

Although limited impacts from work function metal (WFM) patterning are expected for vertical transport FETs (VTFETs), multiple WFM patterning steps and WFM thickness differentials between the n-type and p-type FETs can result in added process complexity and lead to device variation. Moreover, integrating a separate channel material for the n-type FET, e.g., silicon, and the p-type FET, e.g., silicon germanium, is extremely challenging and costly to implement for fabrication of VTFETs.

Accordingly, embodiments of the present invention provide methods of making semiconductor devices with multiple threshold voltages without channel doping. As will be described in greater detail herein, a common WFM is used for both the pFET and nFET to provide the semiconductor devices with multiple threshold voltages. For example, by choosing a pFET channel region material which has a valence band edge shift towards the conduction band edge of the nFET channel region material then the pFET gate work function required to achieve a specific threshold voltage, or off-state leakage current (e.g., the lowest pFET threshold voltage, which results in the highest off-state leakage current), approaches the nFET gate work functions utilized in the device menu. If the valence band edge shift is large enough, then the pFET gate work function will have a value in between the nFET gate work functions used for the highest and lowest nFET threshold voltages. This results in interdigitation of the pFET and nFET gate work functions, thereby permitting sharing of the pFET gate work functions with the nFET and vice versa. Traditionally, each of the nFET and pFET had an exclusive work function, which can furthermore employ a work function modifying material to change (typically to reduce) the work function value. Thus, the low threshold voltage nFET had a nFET work function material with a work function modifying material, while the high threshold voltage nFET had the same nFET work function material but without the work function modifying material. Correspondingly, the low threshold voltage pFET had a pFET work function material, while the high threshold voltage pFET had the same pFET work function material but with the work function modifying material. The present invention differs from the aforementioned traditional approach in that it enables sharing of the nFET and pFET work function materials across both of the nFET and pFET, such that no single work function material, either with or without the work function modifying material, is exclusively used on either of the nFET or pFET. Instead, the work function metal is shared between the nFET and pFET.

As will be described in greater detail herein, the common WFM shared between the nFET and the pFET is configured to provide a differential of about 300 millivolts by including an aluminum-induced dipole in the pFET and a nitrided interfacial layer in the nFET. The aluminum-induced dipole in the pFET and the nitrided interfacial layer in the nFET provide independent knobs for producing multiple voltage thresholds, which can be in addition to lanthanum induced dipole formation and WFM thickness variation to provide multiple threshold voltages. Advantageously, patterning for the aluminum-induced dipole in the pFET and the nitrided interfacial layer in the nFET take place prior to WFM deposition, thereby simplifying the fabrication process. Consequently, fabrication of the multi-threshold VTFETs including the aluminum-induced dipole in the pFET and the nitrided interlayer in the nFET utilizes three (3) pre-WFM patterning steps and one (1) post-WFM patterning step to produce four (4) voltage threshold pairs. The integration of the common WFM in both the nFET and pFET enables a simpler process at lower cost and with less boundary effects. The common WFM also helps future scaling to tighter gate pitch.

As noted above, the common WFM in combination with the aluminum-induced dipole in the pFET and the nitrided interlayer in the nFET provide threshold voltage control. More particularly, a silicon oxynitride interfacial layer is formed in the nFET and a silicon dioxide interfacial layer (with aluminum) is formed in the pFET, Because of this, the pFET channel region material has a band bending that is dissimilar from a band bending of the nFET channel region material due to the difference of the interfacial layers. As is known in the art, negative bias temperature instability (NBTI) is considered a major reliability issue for scaled CMOS technologies. Advantageously, the different interfacial layers enable selective Tinv scaling for the nFET while keeping pFET Tinv unchanged to improve the NBTI reliability. Selective scaling of the nFET equivalent oxide thickness (EOT) is reduced because of the presence of the silicon oxynitride interfacial layer whereas the pFET is unchanged.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to the Figures, FIGS. 1-13 illustrate exemplary methods for fabricating a semiconductor device having multiple threshold voltages with a common gate material for both the nFET and the pFET.

FIG. 1 illustrates a cross-sectional view and a top down view representative of an intermediate semiconductor structure 10 up to formation of vertically oriented fins (i.e., the vertical channel region) 12 for both the nFET and pFET regions, 14, 16, respectively, on a substrate 18. The fins 12, one of which is shown for each of the pFET and nFET regions 14, 16, respectively, extends vertically from the substrate 18. Stated differently, the fin 12 is normal to or perpendicular to the substrate 18 including a portion having a shape of a rectangular parallelepiped. The fins 12 subsequent to patterning include a hardmask 20 on a top surface thereof. Any patterning technique can be used to form the fins as is known in the art including sidewall imaging transfer processes. The etching to form the fins 12 can include a dry etching process such as, for example, reactive ion etching, plasma etching, ion etching, or laser ablation. The fins 12 in both the nFET and pFET regions, 14, 16, respectively, are both formed of crystalline silicon.

Although only one fin 12 is depicted in each region 14, 16, multiple fins 12 can be arranged in each region such that the multiple fins 12 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each fin 102 includes a pair of parallel sidewalls along the lengthwise direction.

The direction along which a semiconductor fin 12 laterally extends the most is herein referred to as a "lengthwise direction" of the fin. The height of each semiconductor fin 12 can be in a range from about 5 nm to about 300 nm, although lesser and greater heights can also be employed. The width of each semiconductor fin 12 can be in a range from about 5 nm to about 100 nm, although lesser and greater widths can also be employed. In various embodiments, the fins 12 can have a width in the range of about 4 nm to about 20 nm, or can have a width in the range of about 5 nm to about 15 nm, or in the range of about 6 nm to about 8 nm. In various embodiments, the fin 12 can have a height in the range of about 25 nm to about 75 nm, or in the range of about 40 nm to about 50 nm. The channel length, i.e., length of the fin 12 in the vertical direction from the substrate 18, in the nFET region 14 and the pFET region 16 are equal to one another. It should be apparent that embodiments of the present invention are not limited to this particular structure and the semiconductor structure can include other devices formed thereon. Moreover, the intermediate structure 10 is not intended to be limited to any particular method for forming the structure 10 up to formation of the fins 12.

The hardmask 20 can include, for example, a silicon nitride (SiN) hardmask. The hardmask 20 can be deposited using a deposition process, including, but not limited to, PVD, CVD, PECVD, or any combination thereof. Other hard mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The hardmask 20 can be formed of a single material or multiple materials.

The substrate 18 can be any suitable substrate material, such as, for example, any semiconductor material including, but not limited to, silicon. In one or more embodiments and when substrate 18 is a remaining semiconductor material portion of a bulk semiconductor substrate, the substrate 110 18 be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin 12 can include the same semiconductor material, or a different semiconductor material, from substrate 18.

In another embodiment, substrate 18 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 110 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate that can be employed as substrate 110 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from about 10 nm to about 100 nm. Other thicknesses that are lesser than, or greater than, the aforementioned thickness range can also be used as the thickness of the semiconductor layer of the SOI substrate. The insulator layer of the SOI substrate can have a thickness from about 1 nm to about 200 nm. Other thicknesses that are lesser than, or greater than, the aforementioned thickness range can also be employed as the insulator layer.

Figure 2:
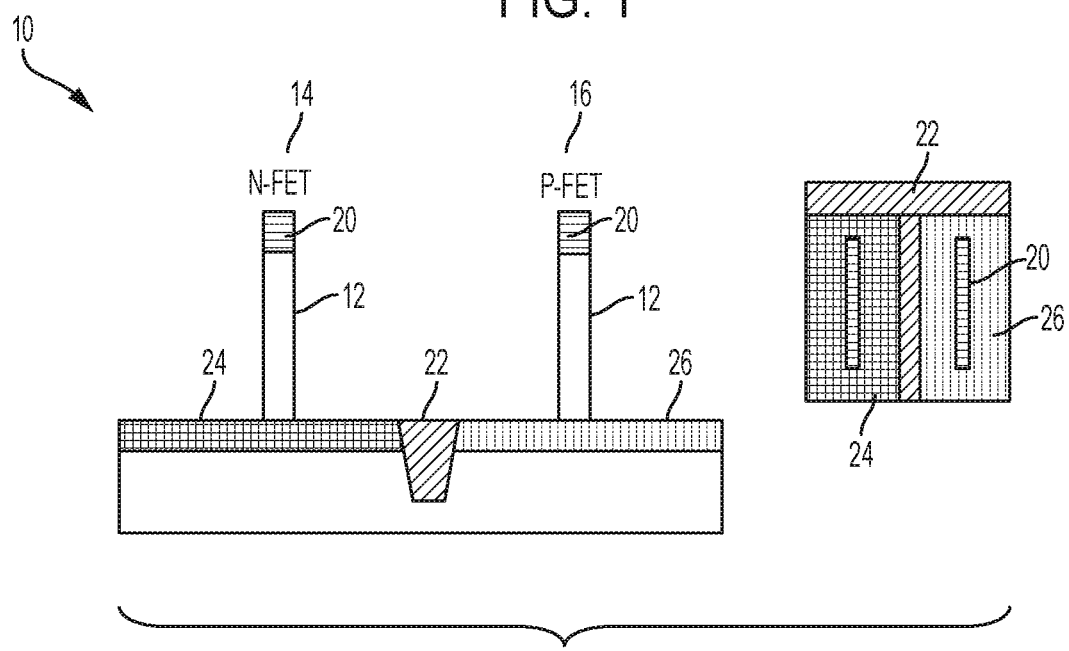
FIG. 2 depicts a cross-sectional view of the semiconductor structure after a fabrication operation according to one or more embodiments of the present invention.

As shown in FIG. 2, the adjacent regions 14, 16 formed on the substrate 18 can be separated by shallow trench isolation region 22. The shallow trench isolation regions can be created early during the semiconductor device fabrication process, e.g., before the transistors are formed. The key steps for forming the shallow trench isolation regions typically involve etching a pattern of trenches in the substrate, depositing one or more dielectric materials (such as silicon dioxide) to fill the trenches, and removing the excess dielectric using a technique such as chemical-mechanical planarization.

A bottom epitaxy layer can be formed by epitaxial growth and/or deposited onto the substrate 18, which can subsequently be in-situ doped to provide an n-type doped semiconductor or a p-type doped semiconductor. By way of example, silicon can be doped with an n-type dopant (e.g., phosphorus or arsenic) to form a bottom source or drain region 24 for the nFET 14 or with a p-type dopant (e.g., boron or gallium) to form the bottom source or drain region 26 for the PFET 16.

As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C. The silicon can be doped with an n-type dopant (e.g., phosphorus or arsenic) or a p-type dopant (e.g., boron or gallium). The dopant concentration in the source/drain generally can range from about $-1 \times 10^{19}$ cm$^{-3}$ to about $2 \times 10^{21}$ cm$^{-3}$, or, in other embodiments, from about $2 \times 10^{20}$ cm$^{-3}$ to about $1 \times 10^{21}$ cm$^{-3}$.

Figure 3:
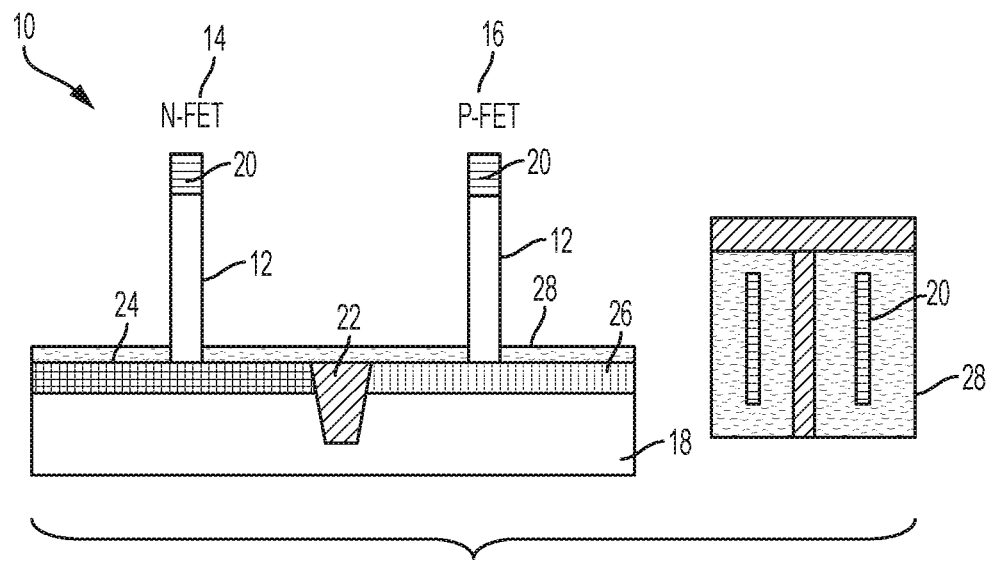
FIG. 3 depicts a perspective view of the semiconductor structure after a fabrication operation according to one or more embodiments of the present invention.

FIG. 3 depicts the structure 10 of FIG. 2 subsequent to formation of a bottom spacer layer 28, which can generally be deposited by any non-conformal deposition methods that provides a faster deposition rate on the planar surface and slower deposition rate on the sidewall surface including but not limited to plasma vapor deposition (PVD), high density plasma (HDP) deposition or the like. The bottom spacer layer can be disposed between the vertically oriented fin structures. The PVD or HDP process is highly directional and deposits the spacer onto the bottom of the trenches but less on fin sidewall. After directional deposition of bottom spacer, an etch-back process can be performed to remove the any residue of spacer materials from a sidewall of the fin 12. In PVD, a pure source material is gasified via evaporation, the application of high power electricity, laser ablation, or the like. The gasified material will then condense on the substrate material to create the desired layer. The bottom spacer can be a low k dielectric material. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), SiCN, or any combination thereof or the like. In one or more embodiments, the bottom spacer layer can have a thickness in the range of about 3 nm to about 10 nm, or in the range of about 3 nm to about 5 nm. In one or more embodiments, the bottom spacer 28 can be an oxide dielectric such as, for example, silicon dioxide.

Figure 4:
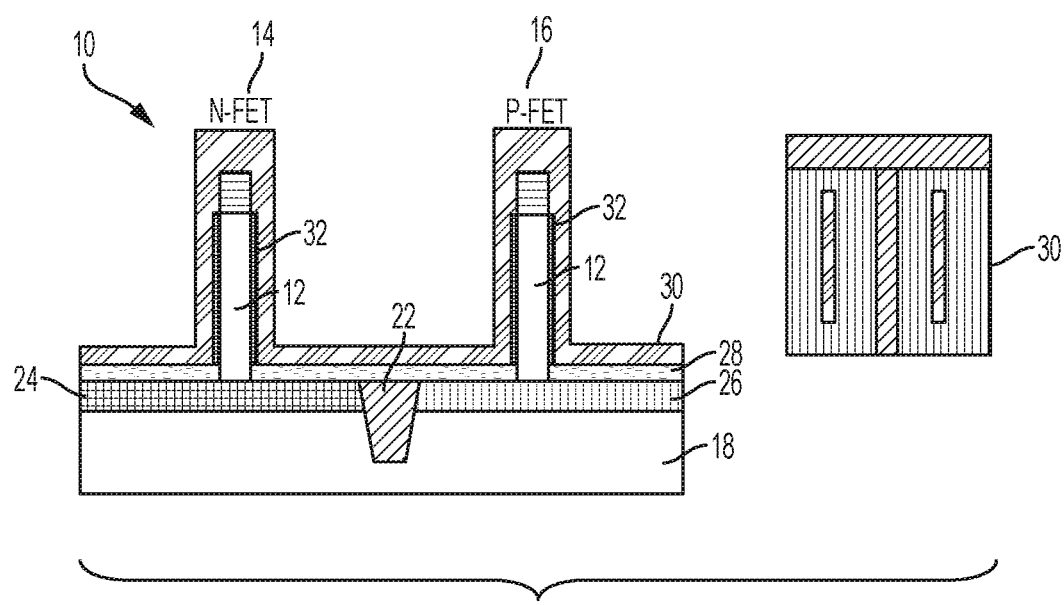
FIG. 4 depicts a cross-sectional view of the semiconductor structure after a fabrication operation according to one or more embodiments of the present invention.

FIG. 4 depicts the structure 10 of FIG. 3 subsequent to an NH$_3$-based thermal anneal or a plasma anneal so as to form a thin interfacial layer 32 of silicon oxynitride (SiON) on the surface of the fins 12, i.e., the exposed silicon surfaces of fins 12 reacts with the NH$_3$ based anneal or plasma exposure to form the SiON at the interface of a few angstrom. Subsequent to the NH$_3$ based anneal or plasma exposure, conformal deposition of a titanium nitride layer 30 is performed, which serves as a hardmask to pattern the SiON interfacial layer.

Figure 5:
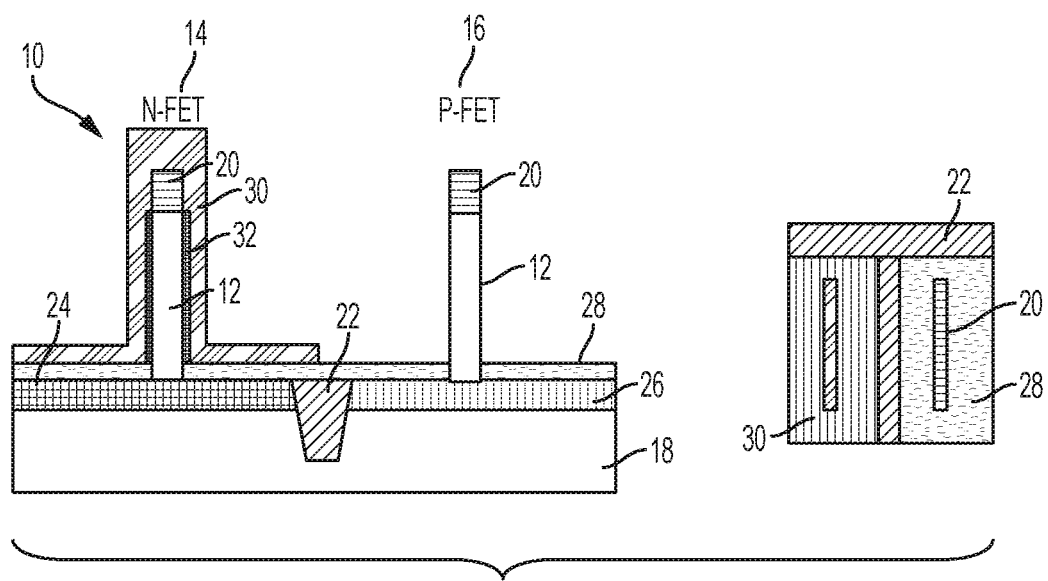
FIG. 5 depicts a cross-sectional view of the semiconductor structure after a fabrication operation according to one or more embodiments of the present invention.

FIG. 5 depicts the structure 10 of FIG. 4 subsequent to patterning and removal of the TiN layer 30 from the pFET 16. A trilayer including an organic planarizing layer can be deposited as block mask on the substrate 18 and patterned to block the nFET region during removal of the TiN layer 30 from the pFET region 16. A standard wet etch removal process selective to oxides can be used to remove the TiN layer 30 from the pFET region 16 and the nitrided interfacial layer 32 from sidewalls of the fins 12 in the pFET region 16. By way of example, the pFET region 16 can be exposed to a standard clean process such as SC-1, which is an aqueous solution containing ammonium hydroxide and hydrogen peroxide.

Figure 6:
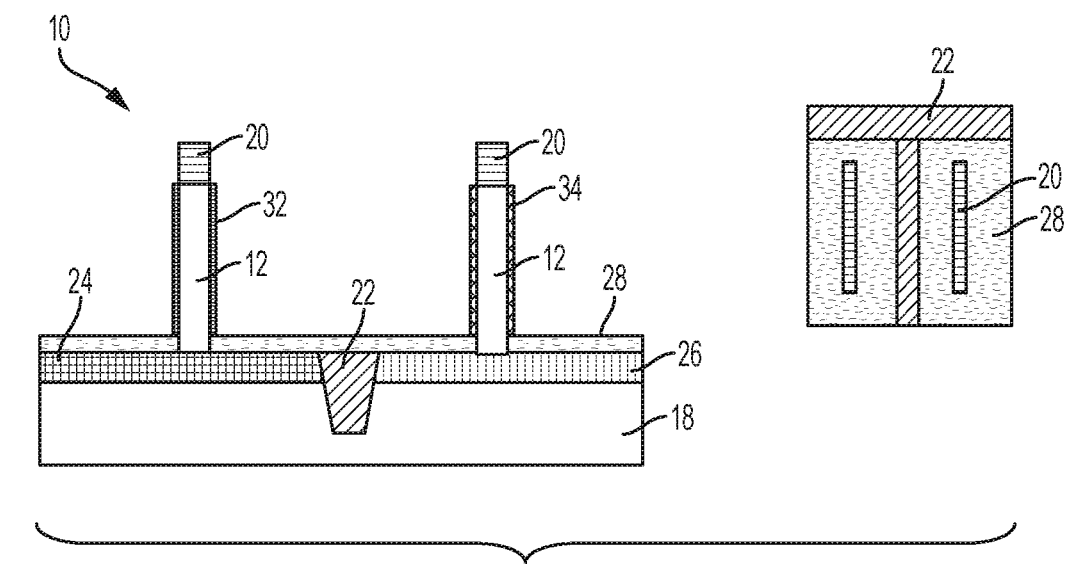
FIG. 6 depicts a cross-sectional view of the semiconductor structure after a fabrication operation according to one or more embodiments of the present invention.

FIG. 6 depicts the structure 10 of FIG. 5 subsequent to removal of the block mask followed by removal of the TiN layer 30 from the nFET region 14. Removal of the TiN layer 30 is selective to the nitrided interfacial layer 32 such that the nitrided interfacial layer 32 remains the sidewalls of the fins 12 in the nFET region 14. Additionally, an oxide layer 34, e.g., SiO$_2$, is formed on the sidewalls of the fins 12 in the pFET region 16. The oxide can be formed by chemical oxidation such as exposure to ozone or by application of a standard clean process such as the SC1 aqueous solution of ammonium hydroxide and hydrogen peroxide.

Figure 7:
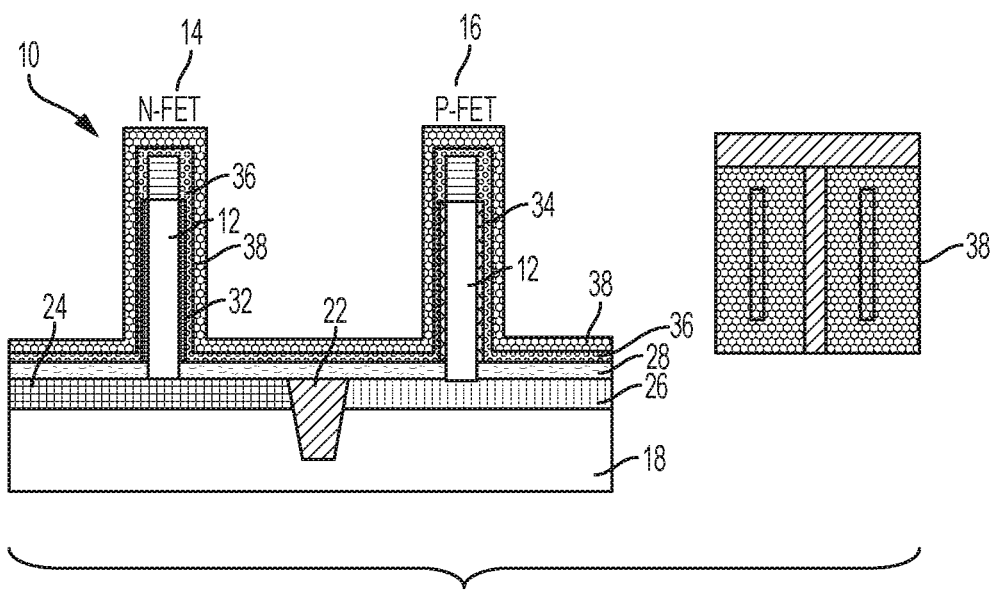
FIG. 7 depicts a cross-sectional view of the semiconductor structure after a fabrication operation according to one or more embodiments of the present invention.

FIG. 7 depicts the structure 10 of FIG. 6 subsequent to conformal deposition of a high k dielectric layer 36 followed by conformal deposition of an aluminum oxide containing layer 38. The high k gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, or any combination thereof. Examples of high-k materials (with a dielectric constant greater than 7.0) include, but are not limited to, metal oxides such as hafnium oxide, hafnium silicon oxide, hafnium silicon oxynitride, hafnium zirconium oxide, hafnium zirconium oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The aluminum containing layer 38 can be a metal stack such as titanium nitride (TiN)/aluminum oxide ($Al_2O_3$) or an aluminum containing alloy/titanium nitride. Suitable aluminum containing alloys include, but are not limited to, titanium aluminum carbide (TiAlC), TiAl, aluminum carbide (AlC), and the like. An exemplary aluminum containing layer 38 is a trilayer stack of TiN/$Al_2O_3$/TiN. The thickness can be varied to provide different voltage thresholds for the pFET 16.

Figure 8:
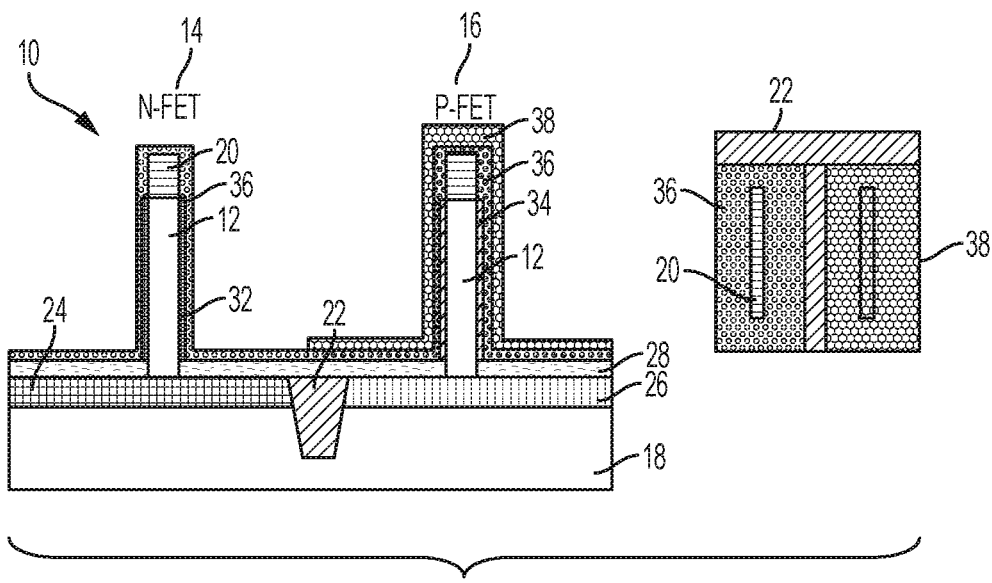
FIG. 8 depicts a cross-sectional view of the semiconductor structure after a fabrication operation according to one or more embodiments of the present invention.

FIG. 8 depicts the structure 10 of FIG. 7 subsequent to metal patterning so as to remove the aluminum containing layer 38 from the nFET region 14 followed by an annealing step to drive in the aluminum (Al) to the silicon dioxide layer 34 (i.e., $SiO_2$ with Al), which functions as a work function modifying material. A mask can be applied to the pFET region 16 where the work function modifying material is to be retained and the work function modifying material is removed from the unmasked region, i.e., the nFET region. The annealing step is at a temperature greater than 800° C. The annealing step can be a rapid thermal anneal (RTA), laser anneal, flash anneal, or any suitable combination of those processes. An optional amorphous silicon cap can be provided on the aluminum oxide containing layer 38 prior to the drive in anneal of the aluminum to the silicon dioxide layer 34.

Figure 9:
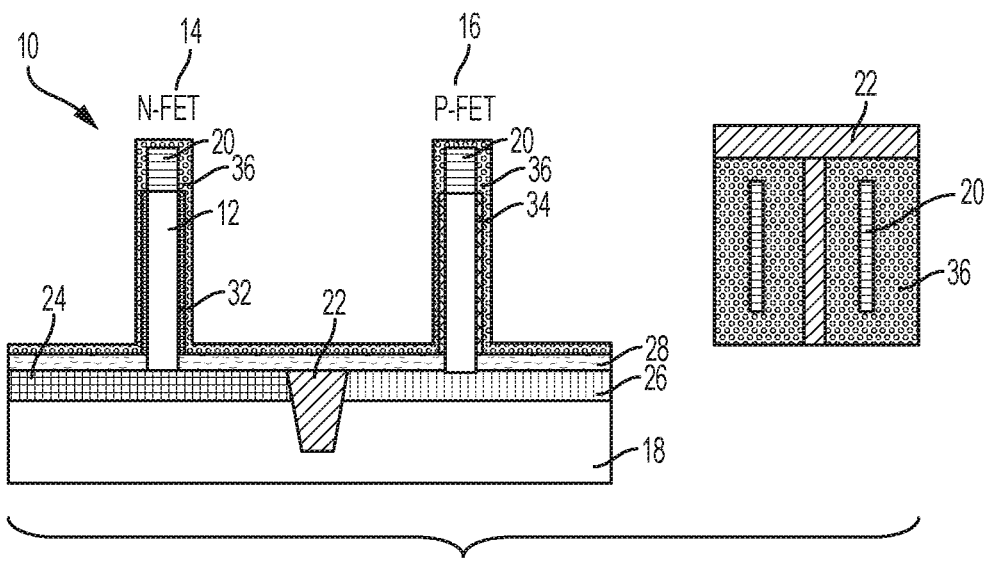
FIG. 9 depicts a cross-sectional view of the vertical field effect transistor structure after a fabrication operation according to one or more embodiments of the present invention.

FIG. 9 depicts the structure 10 of FIG. 8 subsequent to removal of the metal layer 36 in the pFET region 16 selective to the high k dielectric layer 36. The metal layer can be removed by a wet etch process. A work function modifying material can then be applied over the dielectric layer 36 in the selected nFET and pFET regions 14 and 16 to provide more than four threshold voltage offerings. A mask is then applied to the selected nFET and pFET regions where the work function modifying material is to be retained and the work function modifying material is removed from the unmasked nFET and pFET regions 14 and 16. Exemplary work function modifying materials for the selected nFET and pFET regions include Group IIA elements of the periodic table, Group IIB elements of the periodic table, lanthanum oxide, or the like. The substrate is then subjected to an annealing step at a temperature greater than 800° C. It should be apparent that the lanthanum dipole in the nFET 14 is formed prior to WFM deposition so that the n/p-FET pairs have a common WFM. This embodiment forms aluminum induced dipoles, followed by the lanthanum induced dipoles for illustration purposes, however, the opposite order is feasible as far as both processes are employed prior to WFM deposition.

Figure 10:
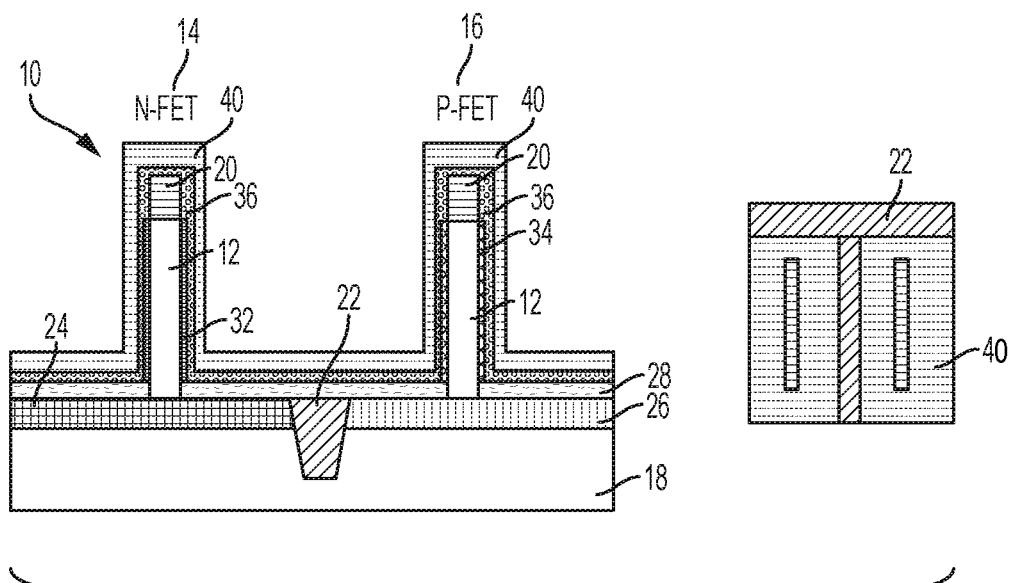
FIG. 10 depicts a cross-sectional view of the semiconductor structure after a fabrication operation according to one or more embodiments of the present invention.

FIG. 10 depicts the structure 10 of FIG. 9 subsequent to conformal deposition of a common WFM 40 on both the nFET 14 and the pFET 16. The common WFM is the same for both the nFET 14 and pFET 16. Advantageously, there is no need to pattern the WFM 40 for the nFET 14 and pFET 16 for a given threshold voltage pair as the voltage threshold is set by the interfacial engineering, e.g., the presence of the silicon dioxide layer 32 on sidewalls of fin 12 in the nFET 14 and the silicon oxynitride with aluminum layer 34 on sidewalls of fin 12 in the pFET 16. More than one common WFM can be employed to increase the number of threshold voltage offerings.

Non-limiting examples of suitable work function materials include ruthenium, palladium, platinum, cobalt, nickel, conductive metal oxides, hafnium, zirconium, titanium, tantalum, aluminum, metal carbides (e.g., hafnium carbide, zirconium carbide, titanium carbide, and aluminum carbide), aluminides, or any combination thereof. In some embodiments the work function material includes titanium nitride. In some embodiments the work function material includes titanium nitride, titanium aluminum carbide, or a combination thereof. The WFM(s) can be deposited by a suitable deposition process, for example, CVD, PECVD, PVD, ALD, plating, thermal or e-beam evaporation, and sputtering. By way of example, a WFM 40 of titanium nitride (TiN) is be conformally deposited onto the structure 10. The thickness of the WFM can be about 1 nm to about 10 nm.

Figure 11:
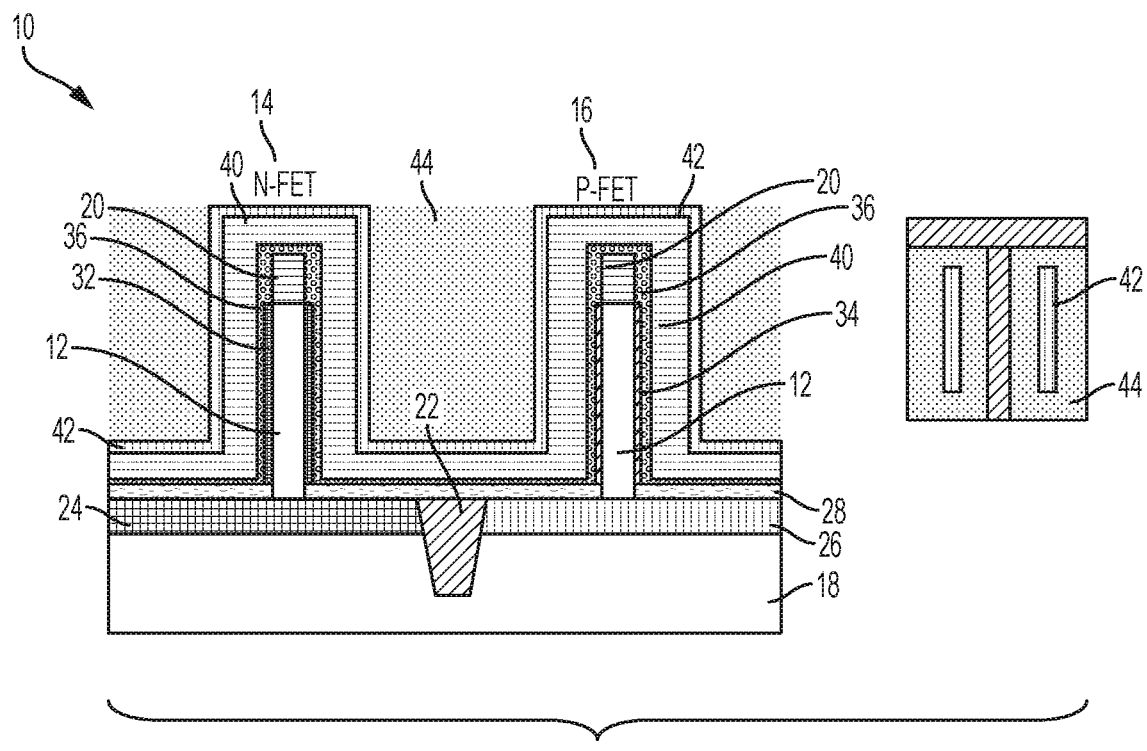
FIG. 11 depicts a cross-sectional view of the semiconductor structure after a fabrication operation according to one or more embodiments of the present invention.

FIG. 11 depicts the structure 10 of FIG. 10 subsequent to gate encapsulation by conformal deposition of capping layer 42. Suitable gate encapsulation materials are not intended to be limited and can be silicon nitride, silicon oxynitride, and combinations thereof. The capping layer 42 protects the WFM 40 from subsequent processing. Subsequent to conformal deposition of capping layer 42, an oxide layer 44 is deposited onto the structure to fill the spaces therein followed by a planarization process such as chemical mechanical planarization to the gate encapsulation layer 42.

Figure 12:
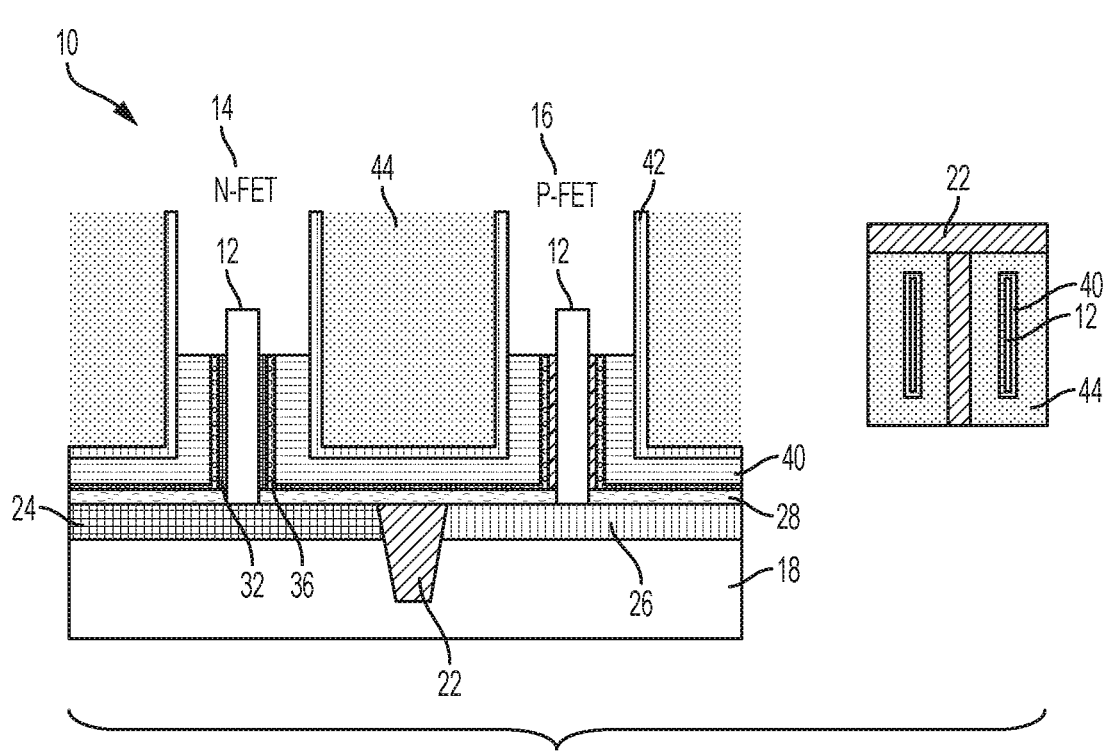
FIG. 12 depicts a cross-sectional view of the semiconductor structure after a fabrication operation according to one or more embodiments of the present invention.

FIG. 12 depicts the structure 10 of FIG. 11 subsequent to gate recess in the nFET 14 and pFET 16 regions. Portions of the gate encapsulation layer 42, the common WFM 40, the high k dielectric layer 36, the hardmask layer 20, are removed as shown to expose a top portion of the fins 12. Additionally, the respective silicon dioxide layer 32 in the nFET 14 or the silicon oxynitride layer 36 in the pFET are removed to define the gate length (Lg). Again, it should be apparent that there is no variation between the nFET 14 and the pFET 16.

Figure 13:
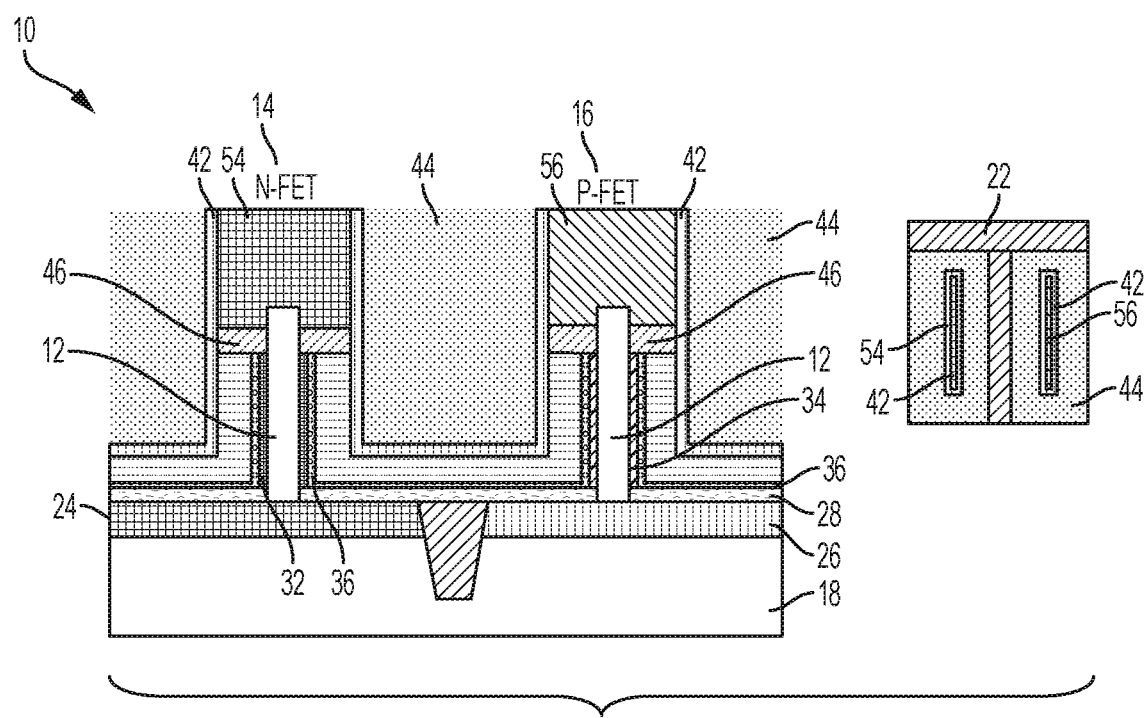
FIG. 13 depicts cross-sectional view of the semiconductor structure after a fabrication operation according to one or more embodiments of the present invention.

FIG. 13 depicts the structure 10 of FIG. 12 subsequent to deposition of a top spacer layer 46 and epitaxial growth of top source/drain regions 54, 56 for the nFET 14 and pFET 16, respectively. Standard process flows subsequent to the above described multi-threshold voltage formation in the nFET 14 and pFET 16 can be used to complete the semiconductor device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a first transistor of a first type comprising a first channel region material including a first gate electrode structure comprising a silicon oxynitride interfacial layer on the first channel region material, a first portion of a high k dielectric layer, and a first portion of a work function metal, wherein the first channel region comprises one or more vertically oriented fins formed of a crystalline silicon; and a second transistor of a second type comprising a second channel region material including a second gate electrode structure comprising a silicon dioxide interfacial layer on the second channel region material, a second portion of the high k dielectric layer, and a second portion of the work function metal, wherein the second channel region comprises one or more vertically oriented fins formed of the crystalline silicon, and wherein the silicon dioxide interfacial layer includes aluminum driven into the silicon dioxide interfacial layer so as to provide an aluminum induced dipole;

wherein the work function material extends continuously from the first portion of the work function metal to the second portion of the work function metal, wherein the work function metal shared between the first and second transistors provide a differential of about 300 millivolts and wherein the first transistor comprises an n-type doped field effect transistor (nFET) and the second transistor comprises a p-type doped field effect transistor (pFET).

2. The device of claim 1, wherein the first channel region material has a band bending that is dissimilar from a band bending of the second channel region material due to the difference of the interfacial layers.

3. The device of claim 1, wherein the work function material comprises titanium nitride.

4. The device of claim 3 further comprising a third transistor of a third type comprising a third channel region material including a third gate electrode structure comprising a silicon oxynitride interfacial layer, a third portion of the high k dielectric layer, a third portion of the work function metal and dipole of a Group IIA element or a Group IIIB element, wherein the first channel region comprises one or more vertically oriented fins formed of a crystalline silicon.

5. The device of claim 4 further comprising a fourth transistor of a fourth type comprising a fourth channel region material including a fourth gate electrode structure comprising a silicon dioxide with aluminum interfacial layer, a fourth portion of the high k dielectric layer, a fourth portion of the work function metal, and a dipole of a Group IIA element or a Group IIIB element, wherein the second channel region comprises one or more vertically oriented fins formed of the crystalline silicon.

6. The device of claim 1, wherein the first transistor and the second transistor have different threshold voltages.

7. The device of claim 5, wherein the first, second, third, and fourth transistors have different threshold voltages.

8. The device of claim 1, wherein the high k dielectric layer of comprises hafnium oxide, hafnium silicon oxide, hafnium silicon oxynitride, hafnium zirconium oxide, hafnium zirconium oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

9. The device of claim 1, wherein the first type comprises an n-typed doped vertical field effect transistor and the second type comprises a p-typed doped vertical field effect transistor.

10. A semiconductor device comprising: a substrate; a shallow trench isolation region in the substrate separating at least one n-type doped field effect transistor (nFET) and at least one p-type doped field effect transistor (pFET), wherein the at least one nFET comprises:

an n-type doped bottom source or drain (source/drain) region, one or more vertically oriented fins formed of silicon extending from the bottom source/drain region, a bottom spacer layer; a silicon oxynitride interfacial layer on sidewalls of the one or more vertically oriented fins, a first portion of a high k dielectric layer overlying the silicon oxynitride interfacial layer, a first portion of a work function metal on the high k dielectric layer, a top spacer layer and a n-type doped top source/drain region on the top portion of the one or more fins; and wherein the at least one pFET comprises:

a p-type doped bottom source/drain region, one or more vertically oriented fins formed of the silicon extending from the bottom source/drain region, a bottom spacer layer; a silicon dioxide interfacial layer on sidewalls of the one or more vertically oriented fins, a second portion of the high k dielectric layer overlying the silicon dioxide interfacial layer, a second portion of the work function metal on the high k dielectric layer, a top spacer layer and a p-type doped top source/drain region on the top portion of the one or more fins, wherein the silicon dioxide interfacial layer includes aluminum driven into the silicon dioxide interfacial layer so as to provide an aluminum induced dipole;

wherein the work function metal extends continuously from the first portion of the work function metal to the second portion of the work function metal so as to be shared by the at least one nFET and the at least one pFET.

11. The device of claim 10, wherein the work function material comprises titanium nitride.

12. The device of claim 10, wherein the high k dielectric layer comprises hafnium oxide, hafnium silicon oxide, hafnium silicon oxynitride, hafnium zirconium oxide, hafnium zirconium oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, or lead zinc niobate.

13. The device of claim 10, wherein the aluminum is at a sidewall surface of the one or more fins in the pFET to define an aluminum induced dipole.

* * * * *